(12) United States Patent
Kay et al.

(10) Patent No.: US 12,113,510 B2
(45) Date of Patent: Oct. 8, 2024

(54) TRANSVERSELY-EXCITED FILM BULK ACOUSTIC RESONATORS WITH MULTIPLE PIEZOELECTRIC MEMBRANE THICKNESSES ON THE SAME CHIP

(71) Applicant: Murata Manufacturing Co., Ltd., Nagaokakyo (JP)

(72) Inventors: Andrew Kay, Provo, UT (US); Patrick Turner, San Bruno, CA (US); Albert Cardona, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 721 days.

(21) Appl. No.: 17/339,841

(22) Filed: Jun. 4, 2021

(65) Prior Publication Data

US 2022/0247373 A1 Aug. 4, 2022

Related U.S. Application Data

(60) Provisional application No. 63/144,981, filed on Feb. 3, 2021.

(51) Int. Cl.
*H03H 9/54* (2006.01)
*H03H 3/02* (2006.01)
(Continued)

(52) U.S. Cl.
CPC .............. *H03H 9/54* (2013.01); *H03H 3/02* (2013.01); *H03H 9/02015* (2013.01);
(Continued)

(58) Field of Classification Search
CPC ...... H03H 9/54; H03H 3/02; H03H 2003/023; H03H 2003/021; H03H 9/173; Y10T 29/42; Y10T 29/49005
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| WO | 2016017104 | 2/2016 |
| WO | 2018003273 | 1/2018 |

OTHER PUBLICATIONS

Buchanan "Ceramit Materials for Electronics" 3rd Edition, first published in 2004 by Marcel Dekker, Inc. pp. 496 (Year 2004). 00 Jan. 2004.
(Continued)

*Primary Examiner* — Thiem D Phan
(74) *Attorney, Agent, or Firm* — ArentFox Schiff LLP

(57) ABSTRACT

An acoustic resonator is fabricated with multiple piezoelectric plate thicknesses on a single chip. After conductor patterns are formed on a piezoelectric plate, the plate is bonded to a sacrificial substrate, with the conductor patterns facing the sacrificial substrate. The piezoelectric plate is then thinned to a desired thickness for shunt resonators. A mask is applied to the surface of the plate and selected areas of the piezoelectric plate are further thinned to a desired thickness for series resonators to form a thinned piezoelectric plate. A substrate with swimming pool cavities is bonded to the thinned piezoelectric plate, and the sacrificial substrate is removed.

20 Claims, 10 Drawing Sheets

(51) Int. Cl.
  *H03H 9/02*     (2006.01)
  *H03H 9/13*     (2006.01)
  *H03H 9/17*     (2006.01)
  *H03H 9/205*    (2006.01)
  *H03H 9/56*     (2006.01)

(52) U.S. Cl.
  CPC .... *H03H 9/02157* (2013.01); *H03H 9/02228* (2013.01); *H03H 9/13* (2013.01); *H03H 9/174* (2013.01); *H03H 9/205* (2013.01); *H03H 9/564* (2013.01); *H03H 9/568* (2013.01); *H03H 2003/023* (2013.01); *Y10T 29/42* (2015.01)

(58) Field of Classification Search
  USPC ........................................ 29/25.35, 594, 831
  See application file for complete search history.

(56) References Cited

U.S. PATENT DOCUMENTS

| | | |
|---|---|---|
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,854,049 B2 * | 12/2010 | Yoshino ............ H03H 9/02133 29/25.35 |
| 7,868,519 B2 | 1/2011 | Umeda |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,348,269 B2 * | 7/2019 | Bhattacharjee .... H03H 9/02275 |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2020/0036357 A1 | 1/2020 | Mimura |
| 2020/0235719 A1 | 7/2020 | Yantchev et al. |

OTHER PUBLICATIONS

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Webster Dictionary Meaning of "diaphragm" Merriam Webster since 1828. 1828.

(56) References Cited

OTHER PUBLICATIONS

Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreynl, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 2017.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 2014.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. 2018.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 2018.
Y. Yang, A. Gao et al. "5 Ghz Lithium Niobate MEMS Resonators With High FOM Of 153", 2017 IEEE 30th International Conference in Micro Electro Mechanical Systems (MEMS). Jan. 22-26, 2017. pp. 942-945 2017.
USPTO/ISA, International Search Report and Written Opinion for PCT Application No. PCT/US2019/036433 dated Aug. 29, 2019. 2019.
USPTO/ISA, International Search Report and Written Opinion for PCT Application No. PCT/US2019/058632 dated Jan. 17, 2020. 2020.
G. Manohar, "Investigation of Various Surface Acoustic Wave Design Configurations for Improved Sensitivity." Doctoral dissertation, University of South Florida, USA, Jan. 2012, 7 pages. 2012.
Ekeom, D. & Dubus, Bertrand & Volatier, A.. (2006). Solidly mounted resonator (SMR) FEM-BEM simulation. 1474-1477. 10.1109/ULTSYM.2006.371. 2006.
Mizutaui, K. and Toda, K., "Analysis of lamb wave propagation characteristics in rotated Ycut Xpropagation LiNbO3 plates." Electron. Comm. Jpn. Pt. 1, 69, No. 4 (1986):47-55. doi:10.1002/ecja.4410690406 1986.
Naumenko et al., "Optimal orientations of Lithium Niobate for resonator SAW filters", 2003 IEEE Ultrasonics Symposium—pp. 2110-2113. (Year: 2003) 2003.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

\* cited by examiner

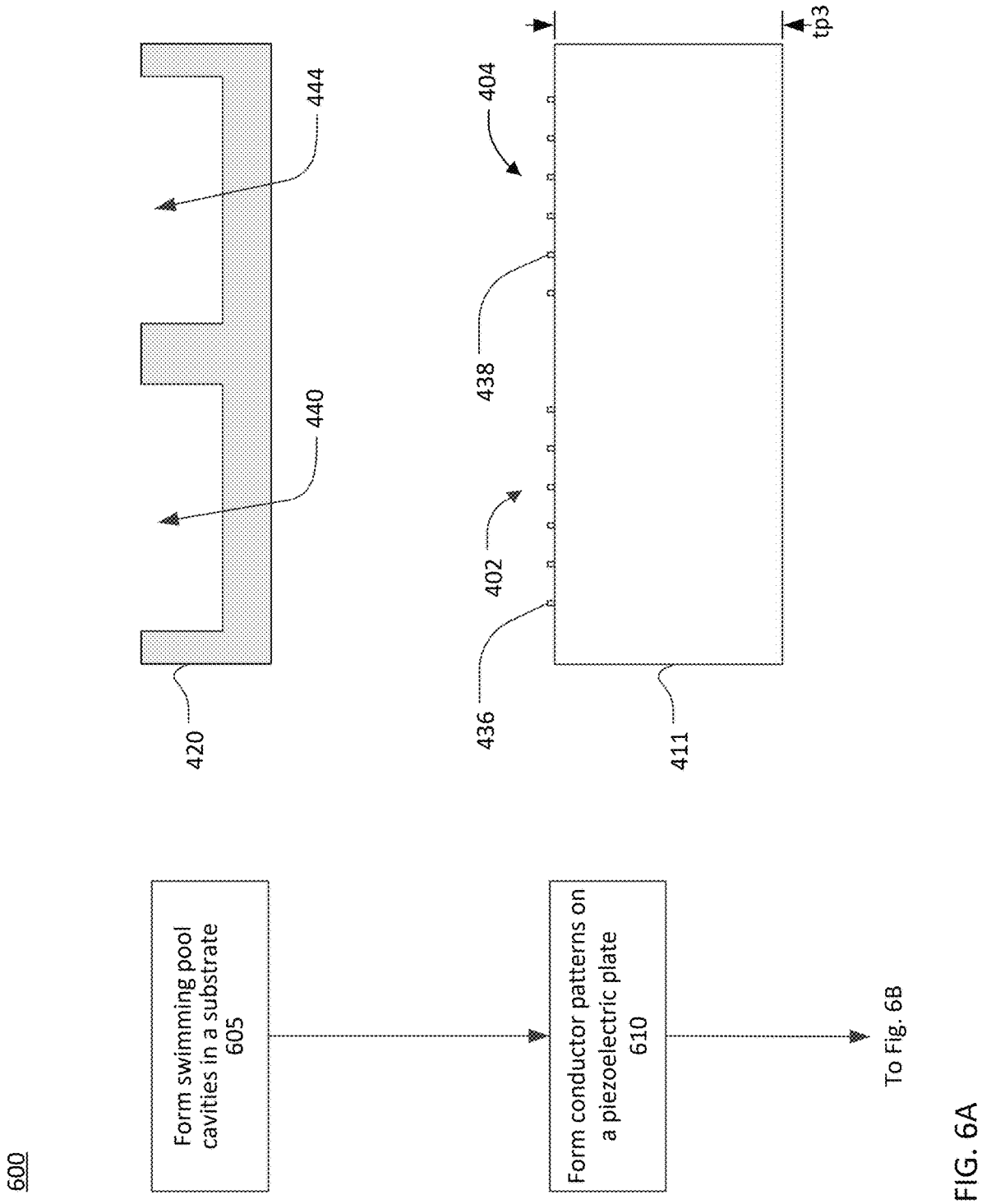

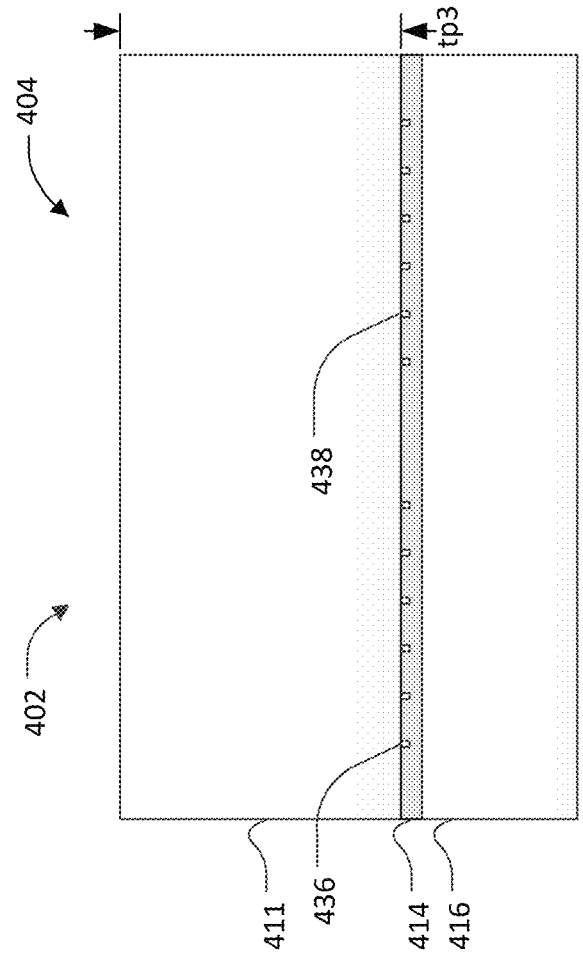

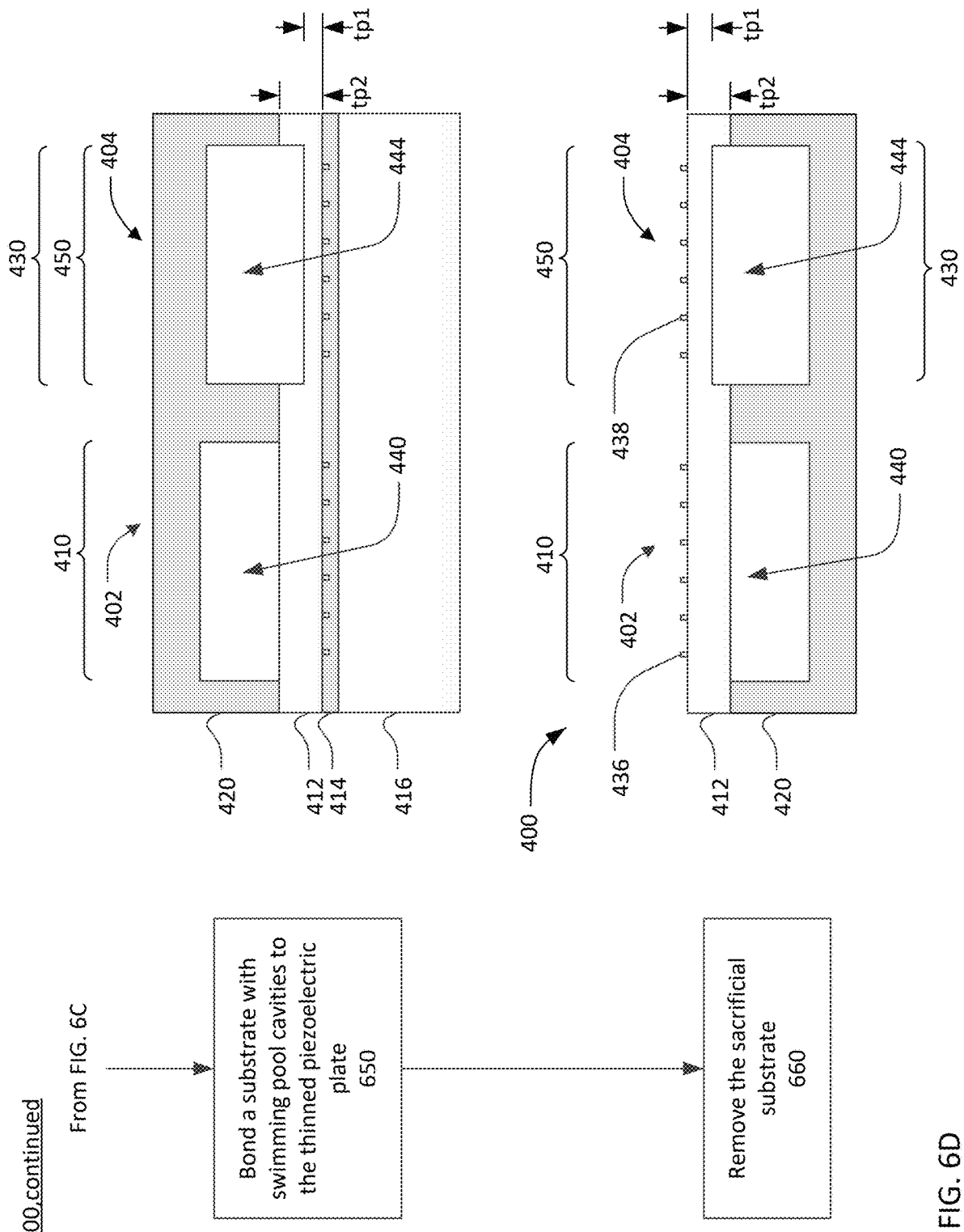

TRANSVERSELY-EXCITED FILM BULK ACOUSTIC RESONATORS WITH MULTIPLE PIEZOELECTRIC MEMBRANE THICKNESSES ON THE SAME CHIP

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

The patent claims priority to co-pending U.S. provisional patent application 63/144,981, filed Feb. 3, 2021, entitled METHOD FOR MAKING XBAR WITH MULTIPLE LN THICKNESSES ON THE SAME CHIP.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Ser. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 6A, 6B, 6C and 6D (collectively "FIG. 6") are a flow chart of a process for fabricating XBARs with multiple piezoelectric resonator thicknesses on the same chip.

Figure 1:
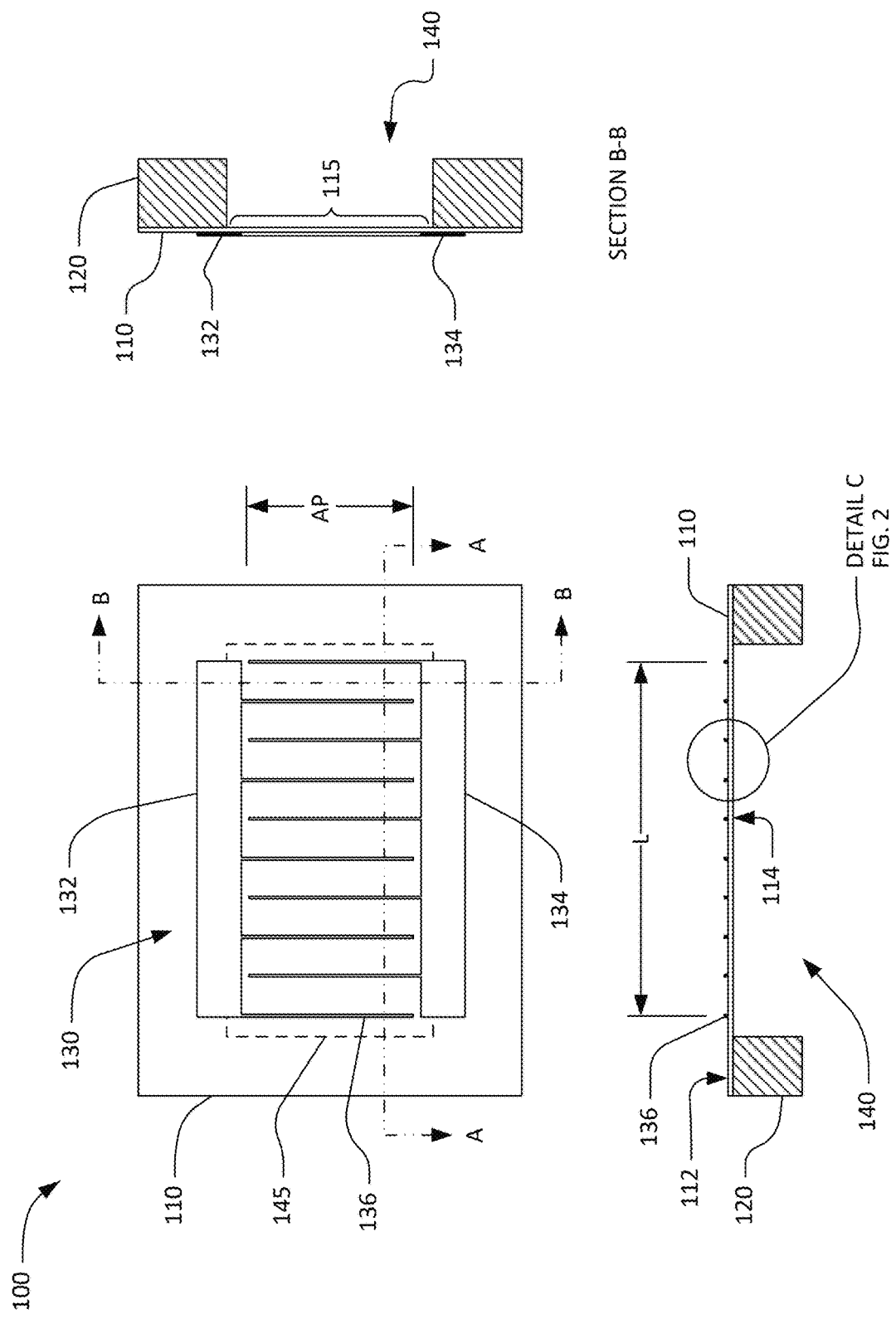
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an interdigital transducer (IDT) formed on a diaphragm or membrane.

Bandpass filters commonly use a ladder filter circuit that includes one or more series resonator connected in series between an input and an output of the filter and one or more shunt resonators, each connected between ground and one of the input, the output, or a node between two series resonators. The resonance frequencies of the shunt resonators are lower than the resonance frequencies of the series resonators. Often, the resonance frequencies of the shunt resonators are located below a lower edge of a passband of the filter and the antiresonance frequencies of series resonators are located above an upper edge of the passband.

The dominant parameter that determines the resonance frequency of an XBAR is the thickness of the piezoelectric membrane or diaphragm suspended over a cavity. Resonance frequency also depends, to a lesser extent, on the pitch and width, or mark, of the IDT fingers. Many filter applications require resonators with a range of resonance and/or anti-resonance frequencies beyond the range that can be achieved by varying the pitch of the IDTs. Since the ability to vary the frequency of an XBAR using IDT dimensions is limited, the resonance frequency of shunt resonators may be lowered (relative to the series resonators) using a frequency-setting dielectric layer on the shunt resonators. U.S. Pat. No. 10,491,291 describes the use of a dielectric frequency setting layer deposited between and/or over the fingers of the fingers of the IDTs of shunt resonators to lower the resonance frequencies of the shunt resonators with respect to the resonance frequencies of the series resonators. The presence of the frequency-setting dielectric layer limits the techniques that can be used to confine the acoustic mode in order to control losses and spurious modes. In addition, the dielectric frequency setting layer thickness required for wide-bandwidth filters facilitates excitation of spurious modes that may be located within the pass-band of the filter.

Described herein are devices having and methods of forming two (or more) different XBAR piezoelectric membrane (e.g., diaphragm) thicknesses on a single die to tune the membranes, rather than by using a dielectric frequency setting layer on the membranes. In some cases, improved XBAR resonators and filters have multiple piezoelectric plate thicknesses on the same chip by further thinning the plate in the selected areas to form different thickness piezoelectric plate membranes over or spanning the cavities in a substrate that the plate is then bonded to. For instance, prior to bonding the plate to the substrate, all areas (e.g., selected and non-selected areas) of a single crystal piezoelectric plate are thinned to have a desired thickness for shunt membranes that will span shunt cavities when the plate is bonded to the substrate. Then, selected areas of the plate are masked and ion milled to a thinner, desired thickness for series membranes that will span series cavities when the plate is bonded to the substrate. This allows for two-chip comparable performance of different thickness resonators to be accomplished on a single XBAR die. The different specific piezoelectric plate thicknesses of this die and using this process enables wider passbands, provides ultra-wideband filters without spurs, better controls edge effects and better controls bandwidth than having the different thicknesses on separate chips or die.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate 110 is a thin single-crystal layer of a piezoelectric material such as lithium niobate, lithium tantalate, lanthanum gallium silicate, gallium nitride, or aluminum nitride. In some cases, plate 110 is two layers of piezoelectric single-crystal material bonded by a bonding layer. In other cases, plate 110 is a lower layer of piezoelectric single-crystal material and an upper bonding layer. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter 145 of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
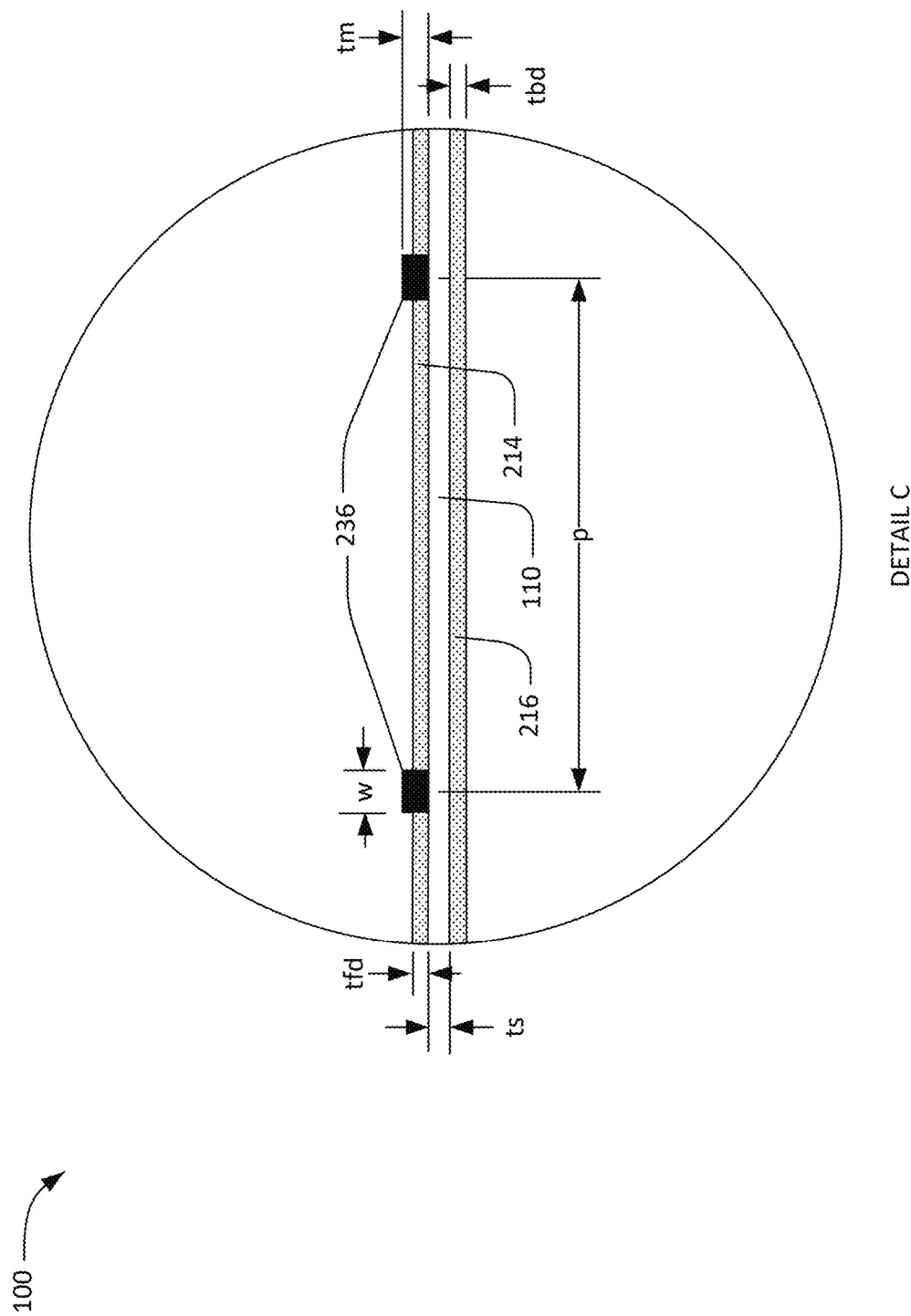
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands n77, n79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness is of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric layer.

However, by using XBARs with multiple piezoelectric resonator thicknesses on the same chip, it is not necessary to have a front side frequency-setting dielectric layer formed over the IDTs of shunt resonators to lower the resonance frequencies of the shunt resonators with respect to the resonance frequencies of series resonators. A piezoelectric plate may be thinned to a desired thickness for shunt resonators at non-selected areas that will be shunt membranes over shunt cavities of a substrate when the plate is bonded to a substrate. The plate may be further thinned to a desired thickness for series resonators at selected areas that will be series membranes over series cavities of a substrate when the plate is bonded to a substrate. The plate is then bonded to the substrate to form the membranes over the cavities.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of one or more oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width w of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
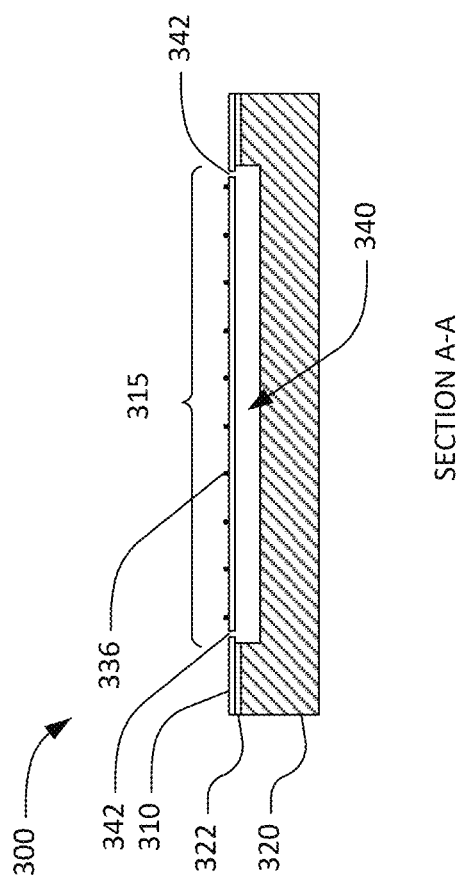
FIG. 3A is an alternative schematic cross-sectional view of the XBAR of FIG. 1.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. The cavity 340 may be formed, for example, by etching the substrate 320 before attaching the piezoelectric plate 310. This type of cavity 340 may be as swimming pool cavity that does not extend to the bottom surface of the substrate. This type of cavity may be formed by masking and etching selected areas of the front surface of the substrate 320 to form both shunt and series cavities. It may also or independently involve selectively etching a sacrificial layer of material deposited in the cavity area locations and depths to form both shunt and series cavities. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be an etch stop layer, a sealing layer, an adhesive layer or layer of other material that is attached or bonded to plate 310 and substrate 320. In other embodiments, the piezoelectric plate 310 is attached directly to the substrate 320 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
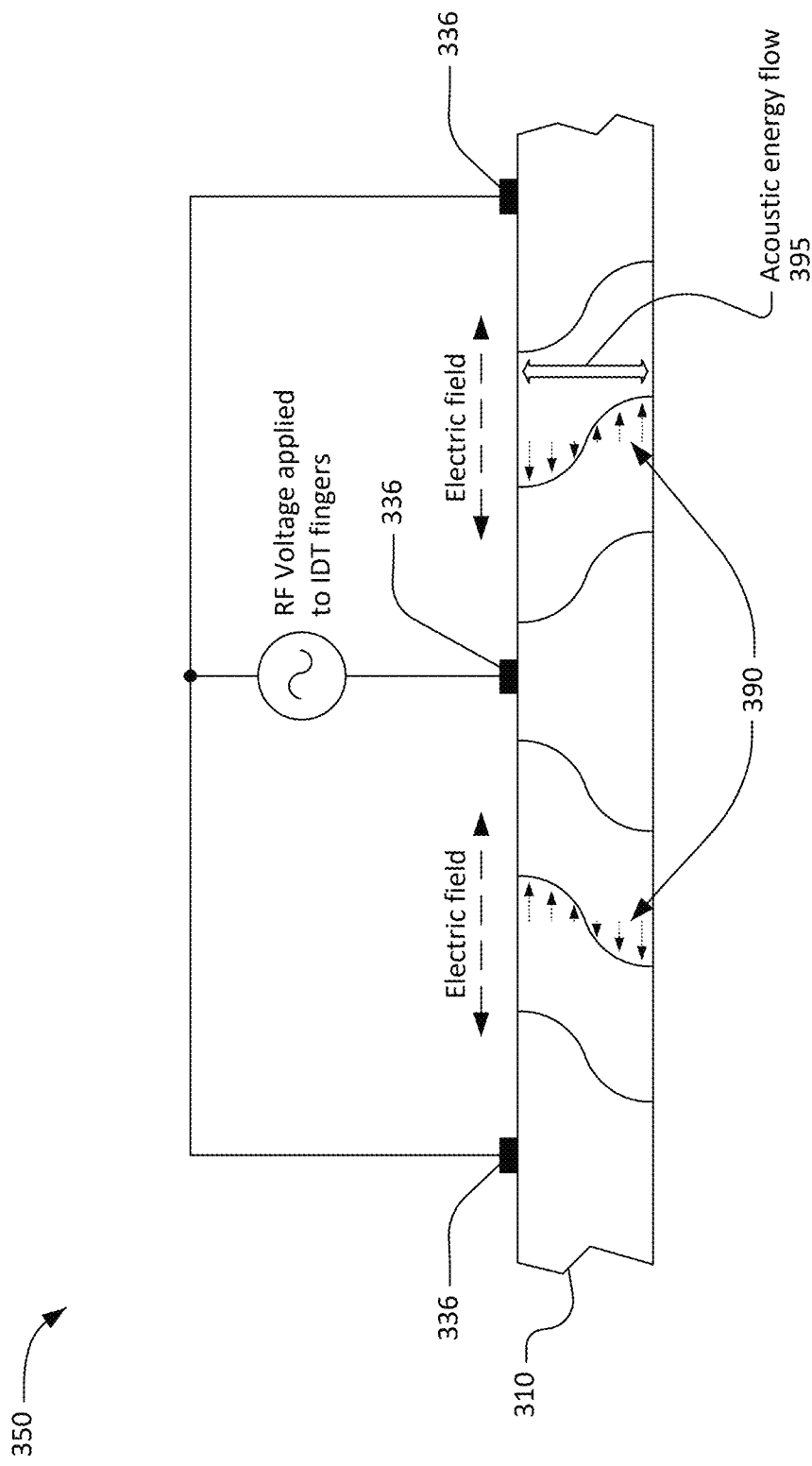
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 390, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3A), the direction of acoustic energy flow of the excited primary shear acoustic mode is substantially orthogonal to the front and back surface of the piezoelectric plate, as indicated by the arrow 395.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
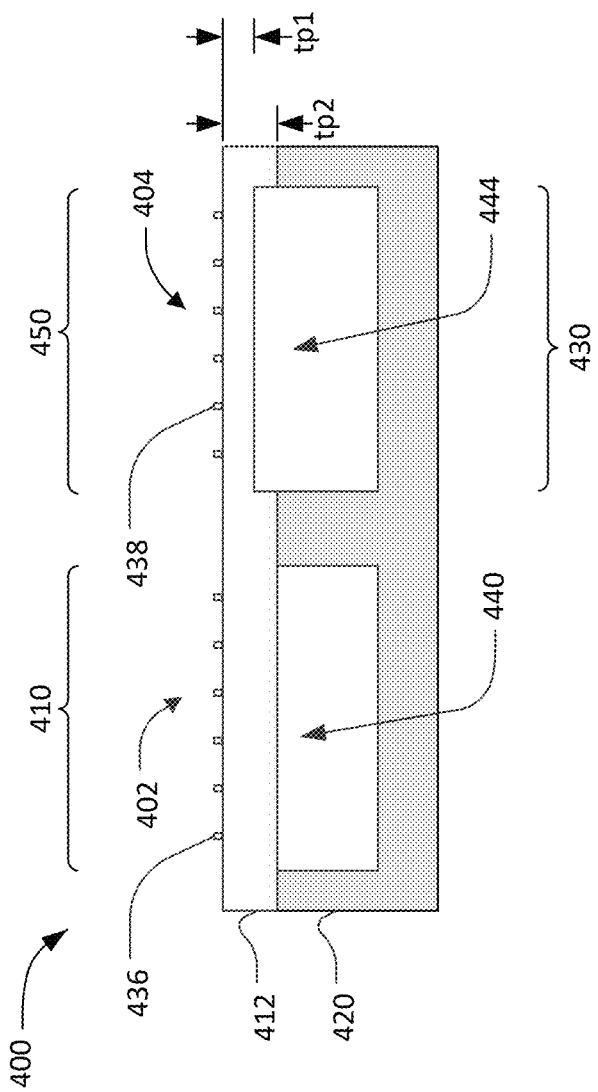
FIG. 4 is an alternative schematic cross-sectional view of improved XBARs with multiple piezoelectric resonator thicknesses on the same chip.

FIG. 4 is a schematic cross-sectional view of improved XBAR resonators 402 and 404 with multiple piezoelectric resonator thicknesses formed on the same chip 400. Chip 400 may be or may be part of a filter device having resonator 402 as lower frequency shunt resonator and resonator 404 as a higher frequency series resonator. In any case, resonator 402 or 404 can be any of the resonators described herein. Chip 400 may be a portion of a wafer containing many chips that are fabricated simultaneously and then separated by dicing.

Chip 400 has substrate 420 having a shunt cavity 440 and a series cavity 444. A shunt piezoelectric membrane (e.g., diaphragm) 410 spans the shunt cavity 440; and a series piezoelectric membrane 450 spans the series cavity 444. The shunt piezoelectric membrane 410 is piezoelectric plate 412 thinned to a desired thickness tp2 for shunt resonators at non-selected areas of the plate 412 that span shunt cavities 440 of the plate bonded to the substrate. The non-selected areas may be areas that span cavities 440, all areas other than selected areas 430, or areas somewhere between those two. Thickness tp2 may be formed by a planarized (e.g., CMP or polishing) top surface of plate 412 under the IDTs 436 and 438; and a planarized bottom surface of the plate.

The series piezoelectric membrane 450 is piezoelectric plate 412 further thinned to a desired thickness tp1 for series resonators at selected areas 430 of the plate 412 that span series cavities 440 of the plate bonded to the substrate. The series piezoelectric membrane 450 may be an area of piezoelectric plate 412 that is first thinned to thickness tp2 with the non-selected areas, and then is selected as an area that is subsequently further thinned to thickness tp1. Thickness tp1 may be formed by a planarized top surface of plate 412 where the IDTs 436 and 438 are; a planarized bottom surface of the plate that forms thickness tp2; and ion milled selected areas 430 of the bottom surface of the plate that form thickness tp1. Due to the further thinning to tp1, and flip bonding of plate 412 to substrate 420, cavity 444 has a greater height than that of cavity 440. In other embodiments, the bottom of the shunt cavities 440 extend farther down than those of the series cavities 444 to allow for further physical vertical vibration or flexing of the shunt membrane as compared to that of the series membrane.

In one example, a filter device has substrate 420 with more than one of shunt cavities 440 and series cavities 444 on a single die. Piezoelectric plate 412 has a top and bottom surface that are planarized to have a desired thickness tp2 for shunt resonators at areas of shunt membrane 410 spanning the shunt cavities 440. Selected areas 430 of the bottom surface of the plate 412 are ion milled to have a thinner desired thickness tp1 for series resonators at areas of series membrane 450 spanning the series cavities 444 but not spanning the shunt cavities.

Interdigital transducers (IDT) 436 and 438 are formed on a top surface of the piezoelectric plate 412 over the shunt and series cavities, respectively. The IDTs may be formed on the top surfaced of the plate after planarizing the top surface. The shunt and series cavities may be swimming pool cavities. They may be neither back etched nor front etched through the plate.

The thickness tp1 may be between 210 and 550 nm. The thickness tp2 may be between 250 and 600 nm. Thickness tp1 is less than tp2. Generally, thickness tp1 can be between 10 to 40 nm thinner than thickness tp2. In some cases, tp2 is 570, 578 or 585 nm; and tp1 is 220, 230 or 240 nm, respectively. The piezoelectric plate 412 may be a material as noted for plate 110.

By the device 400 having the different plate thicknesses of membranes 410 and 450, it can be used to tune the resonance frequencies of those resonators 402 and 404 on a single chip, rather than, or in addition to, using a dielectric frequency setting layer on the membranes or by having the resonators on separate chips. That is, by using XBARs with multiple piezoelectric resonator thicknesses on the same chip 400, it is not necessary to have a front side frequency-setting dielectric layer formed over the IDTs of shunt resonators to lower the resonance frequencies of the shunt resonators with respect to the resonance frequencies of series resonators.

Figure 5:
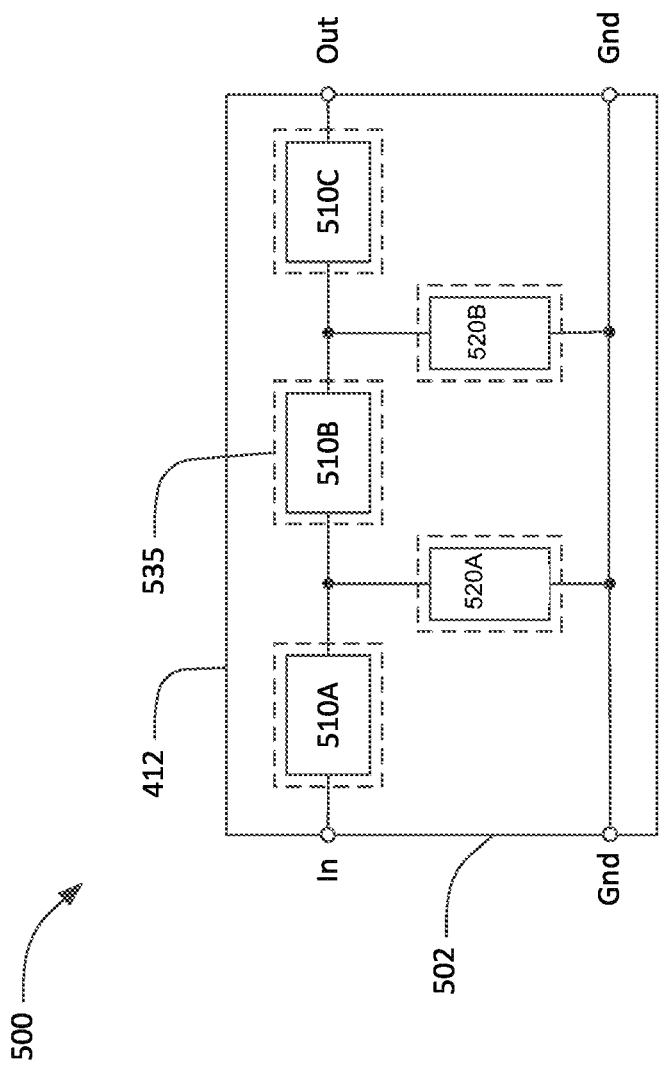
FIG. 5 is a schematic block diagram of a filter using XBARs having resonators with multiple piezoelectric resonator thicknesses on the same chip.
Figure 6C:
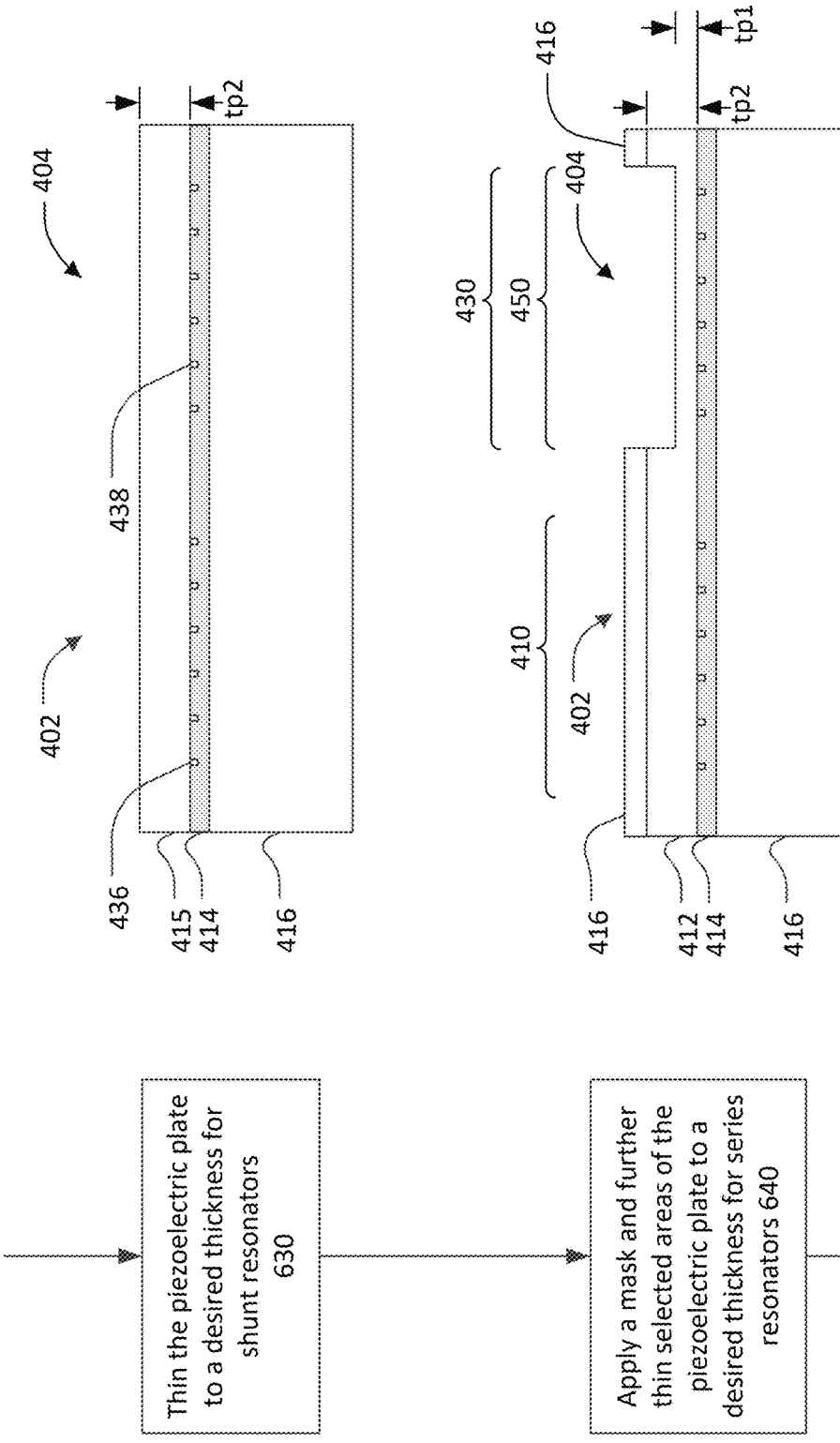

FIG. 5 is a schematic circuit diagram and layout for a high frequency band-pass filter 500 using XBARs with multiple piezoelectric resonator thicknesses on the same chip 502. The filter 500 has a conventional ladder (or half ladder) filter architecture including three series resonators 510A, 510B, 510C and two shunt resonators 520A, 520B on one die or chip 502. The three series resonators 510A, 510B, and 510C are connected in series between a first port and a second port. In FIG. 5, the first and second ports are labeled "In" and "Out", respectively. However, the filter 500 is bidirectional and either port and serve as the input or output of the filter. The two shunt resonators 520A, 520B are connected from nodes between the series resonators to ground. All the shunt resonators and series resonators are XBARs on a single chip 502.

The three series resonators 510A, B, C and the two shunt resonators 520A, B of the filter 500 are formed on a single plate 412 of piezoelectric material bonded to a silicon substrate (not visible). The shunt resonators 520A, B (but not the three series resonators) all have a desired thickness tp2 for shunt resonators at non-selected areas of the plate 412 that are shunt membranes 410 spanning shunt cavities 440 of the plate bonded to substrate 420. The three series resonators 510A, B, C (but not the two shunt resonators) all have further thinned desired thickness tp1 for series resonators at selected areas 430 of the plate 412 that are series membranes 410 spanning series cavities 440 of the plate bonded to the substrate. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Description of Methods

FIG. 6A, FIG. 6B, FIG. 6C and FIG. 6D (collectively "FIG. 6") are a simplified flow chart of an improved process 600 for fabricating XBARs or a filter with resonators 402 and 404 having multiple piezoelectric resonator thicknesses on the same chip 400, such as shown in FIG. 4. Process 600 may describe fabricating two (or more) different XBAR piezoelectric membrane (e.g., diaphragm) thicknesses on the same chip to tune the membranes. It may be method for fabricating an acoustic filter with multiple piezoelectric plate thicknesses on a single chip, To the right of each action in the flow chart is a schematic cross-sectional view representing the end of each action.

The process 600 starts at 605 in FIG. 6A with a substrate and a piezoelectric plate; and ends at 660 in FIG. 6D with completed XBARs of a filter of chip 400. The flow chart of FIG. 6 includes only major process steps. Various conventional process steps (e.g., surface preparation, chemical mechanical processing (CMP), cleaning, inspection, deposition, photolithography, baking, annealing, monitoring, testing, etc.) may be performed before, between, after, and during the steps shown in FIG. 6.

At 605, swimming pool cavities 440 and 444 are formed in a substrate to form substrate 420. In other cases, the cavities may be back etched and not be swimming pool cavities. Forming at 610, may be forming one or more shunt and series cavities to create the substrate 120, 320, or 420 before the piezoelectric plate is bonded to the substrate at 650. A separate cavity may be formed for each shunt and series resonator in a filter device. The cavities may be formed using conventional photolithographic and etching techniques. These techniques may be isotropic or anisotropic; and may use deep reactive ion etching (DRIE). These techniques may etch a sacrificial layer that is formed by masking, etching, depositing the sacrificial layer and planarizing the sacrificial layer. Typically, the cavities formed at 605 are "swimming pool" cavities that will not penetrate through the substrate or layer 320, 420, and the resulting resonator devices will have a cross-section as shown in FIG. 3A or 4. The resulting substrate may be a trap rich silicon wafer.

The substrate material may be that of substrate 120, 320 or 420. The substrate may be a material that allows formation of deep cavities by etching or other processing. The substrate may have sacrificial layer or material such as polycrystalline silicon where the cavities are formed.

Forming swimming pool cavities at 605 prior to bonding the plate to the substrate may require the fewest total process steps as compared to forming the cavities using a back-side etch through the substrate (e.g., as in FIG. 1) or forming the cavities by etching from the front side through the plate after it is bonded to the substrate (e.g., as in FIG. 3A). In a variation of process 600 the cavities are formed in the substrate after 610 and prior to bonding at 650.

At 610 conductor patterns are formed on a thick piezoelectric plate 411. The patterns include IDT 436 for a shunt resonator 402 and IDT 438 for a series resonator 404. Thick piezoelectric plate 411 has thickness tp3 that is greater than thickness tp2. Thickness tp3 may be greater than 250 um. It may be between 150 and 300 um. Forming at 610 may include planarizing (e.g., chemically mechanically polishing (CMP) or otherwise polishing) a front surface of the plate to a flat surface upon which the conductor layers will be molecularly bonded to the planarized plate material, and then further processed. Thus, each IDT may be on a planarized front surface of the piezoelectric plate 411 at selected locations that will be over or span a cavity of a substrate the plate is to be bonded to. Forming IDTs at 610 may include descriptions for forming IDTs in FIG. 4.

The piezoelectric plate 411 may be, for example, Z-cut, rotated Z-cut, or rotated Y-cut lithium niobate, lithium tantalate or a material noted for plate 110. The piezoelectric plate may be some other material and/or some other cut. The plate 411 may be a plate of piezoelectric material as described for plate 412.

Forming at 610 may include forming conductor patterns and dielectric layers defining XBAR devices on the surface of the piezoelectric plate. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Forming the IDTs at 610 may include etch-back processing which commences with blanket depositing IDT conductor material over the exposed top surfaces of plate 411. After this depositing, a patterned photoresist mask may be formed over the IDT conductor material at locations or areas where the IDTs will be formed. The photoresist mask may be blanket deposited over the IDT conductor material and then patterned using photolithography to define the conductor pattern at locations where the mask exists after patterning. The patterned photoresist mask may function like an etch stop in that it will be impervious to (and/or be etched magnitudes slower than the conductor material by) the processes and chemicals used to etch the conductor material. Suitable photoresist materials may include a light-sensitive organic material (e.g., a photopolymeric, photodecomposing, or photocrosslinking photoresist).

After the mask is patterned, the IDT conductor material is etched, such as by being dry etched, and removed where it is not protected by the photoresist mask, thus forming the IDT conductor patterns. The conductor layer can be etched, for example, by an anisotropic plasma etching, reactive ion etching, wet chemical etching, and other etching techniques. The etch etches or removes the conductor over and to the plate 411 over resonators 402 and 404. Plate 411 may be impervious to (or be etched magnitudes slower by) the processes and chemicals used to etch the conductors. After this etch, the photoresist mask is removed from the top surface of the conductor material to leave the pattern of desired conductor material for the IDTs. The remaining desired conductor material includes the IDT conductor and fingers 436 and 438.

Alternatively, the conductor patterns may be formed at 610 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. After forming the conductor patterns, a passivation dielectric layer (not shown) may be formed over the conductor patterns. The passivation layer covers IDTs 436 and 438. The passivation layer may be SiO2 and/or a similar passivation material noted herein. In some cases, the passivation layer is also over the surface of the plate and is bonded to both that surface and the substrate 416 at 620.

At 620 the piezoelectric plate 411 is bonded to a sacrificial substrate 416 using adhesive layer 414, with the conductor patterns and adhesive layer 414 facing and disposed towards the sacrificial substrate. Bonding at 620 may include forming adhesive layer 414 on or over the plate 411 and IDTs; and flipping and bonding the adhesive, IDTs and thick piezoelectric plate 411 to a support wafer having or that is substrate 416. Bonding at 620 may include spin coating and pre-baking adhesive layer 414 covering IDTs 436 and 438 and front surface of plate 411; and bonding the front surface of plate 411 having the adhesive 414 to the back surface of substrate 416. The thickness of adhesive layer 414 may be greater than the thickness of the IDTs (or IDTs with passivation layer noted at 610) so that the top of the IDTs are protected and do not contact substrate 416 during or after bonding.

In some cases, a layer of laser release material (LRL) (not shown) is formed on the back surface of substrate 416 prior to bonding the adhesive layer 414, IDTs and plate 412 to the substate 416. The layer of LRL may be a glass layer and the adhesive layer 414 may be of up to 60 um. In this case, the adhesive may be between 2 and 3 um thick; or it may be 5 um thick.

In some cases, the material of adhesion layer 414 may be blanket deposited over the exposed front surface of the plate 411 and over the IDTs, such as using atomic layer deposition (ALD). It may then be planarized to a desired thickness for bonding and protecting the IDTs, such as using chemical mechanical processing (CMP), prior to bonding the plate to the substrate 416.

Layer 414 may have a thickness from the plate surface to the top of the layer 414 of between 1 and 60 um. Layer 414 may have a thickness that is at least at least 2× the thickness of the IDT fingers tm. It may be 2× the thickness of a second metalization layer over the substrate that connects the busbars to contacts, such as solder bumps. Layer 414 may have a thickness that is between 2 and 3 um. It may be between 4 and 6 um.

The passivation layer 414 may be a glue, Al2O3 or SiO2. In some cases, it is any material suitable for molecular bonding to the plate 411 material and to the substrate 416 material. Substrate 416 may be silicon or sapphire. In some cases, it is polymorphous, thermal oxide, or polycrystalline silicon or sapphire. It may be a material noted for substrate 420.

At 630 the piezoelectric plate 411 is thinned from thickness tp3 to a desired thickness tp2 for shunt resonators, thus forming piezoelectric plate 415. At 630, piezoelectric plate 411 has a top and bottom surface and the bottom surface may be planarized to form plate 412 having a desired thickness tp2 for shunt resonators at areas of shunt membrane 410 that will span the shunt cavities 440. Here, a back surface of piezoelectric plate 411 may be planarized, such as using chemical mechanical processing (CMP) to form piezoelectric plate 415 having desired thickness tp2. Planarizing at 630 may be accurately thinning the thickness of a piezoelectric wafer to for example, 465 nm or another thickness of tp2. In some cases, thinning at 630 is back grinding, polishing and/or ion trimming thick piezoelectric plate 411 to shunt thickness tp2. It may include grinding, polishing and ion trimming to form thickness tp2. Thinning at 630 may include planarizing the back surface of plate 411 to form thickness tp2 of membrane 410 for shunt resonator 402 and at an area where resonator 450 will be further thinned.

At 640 a mask 416 is applied to plate 415 and selected areas 430 of the piezoelectric plate are further thinned from thickness tp2 to a desired thickness tp1 for series resonators, thus forming piezoelectric plate 412. At 640, selected areas 430 of the bottom surface of the plate 412 are ion milled to have a thinner desired thickness tp1 for series resonators at areas of series membrane 450 spanning the series cavities 444 but not spanning the shunt cavities. At 640, the selected areas 430 may be accurately thinned through a patterned mask to a final thickness of for example, 120 nm or another thickness of tp1. Masking at 640 may include applying a hard mask 416 to the back surface of plate 415 having thickness tp2, and patterning the mask to expose the selected areas 430 so those areas can be thinned. The exposed areas are then ion milled to further thin the plate to thickness tp1 of membrane 450 for series resonators 404. Further thinning may be ion milling the exposed selected areas to remove a milled away thickness of the plate to form the desired thickness for series resonators.

Ion milling may be or include ion beam etching, such as using a dry plasma etch method which utilizes a remote broad beam ion/plasma source to remove plate material by physical inert gas and/or chemical reactive gas means. Like other dry plasma etch techniques, the typical figures of merit apply, such as etch rate, anisotropy, selectivity, uniformity, aspect ratio, and substrate damage. However, ion beam etching advances additional dry etch merits, which include wide range of materials, precision etch stops, and indifference to substrate thickness or shape. Generally, the plate incorporates a patterned mask 416, but in some cases a blank plate can be ion milled at 640. Typically, the plate is on a stage that will rotate and tilt. The bombardment of the plate can be well defined and controlled.

The patterned mask may function like an etch stop in that it will be impervious to and/or be ion milled magnitudes slower than the plate 415 by the ion milling processes used on the plate. Plate 415 is not thinned at areas of shunt resonators 402. The selected areas 430 may be the same area as; or between 5 and 10 percent larger (e.g., wider and longer) than the area of the membranes 450. Other processes for thinning the selected areas 430 are considered.

The layer 416 may be a hard mask made out of sputtered Chrome or some other metallization. The thickness of the layer 416 may be equal to the depth of the ion milling tp2-tp1. The thickness of the layer 416 may be based on an experimentally determined optimal thickness of layer 416 for a selective etch used to expose selected areas 430 though layer 416. In other cases, suitable material for mask layer 416 includes photoresist materials such as a light sensitive material, a light-sensitive organic material (e.g., a photopolymeric, photodecomposing, or photocrosslinking photoresist), or an oxide or a nitride hard mask.

At 650 a substrate 420 with swimming pool cavities 440 and 444 is bonded to the thinned piezoelectric plate 412 by a wafer bonding process. Bonding at 650 may be bonding a piezoelectric wafer 412 to a silicon carrier wafer 420. Substrate 420 may be a trap rich silicon wafer that includes cavities 440 and 444 prior to bonding. A trap rich silicon wafer may be a "high resistivity silicon wafer with a trap-rich layer on the surface that is to be bonded to the piezoelectric plate. Bonding at 650 may be flipping, aligning (e.g., indexing) and bonding the substrate to the plate so that membranes 410 and IDTs 436 span cavities 440; and so that membranes 450 and IDTs 438 span cavities 444. Bonding at 650 may include bonding bath-tubbed cavity and trap rich silicon wafer 420 to plate 412 to form resonators 402 and 404. Bonding at 650 may include flipping and bonding the back surface of piezoelectric plate 412 to a front surface of the substrate 420 so that the selected areas 430 on a back surface of the plate are facing (e.g., disposed towards) and span the series cavities 444 and the IDTs are on a front surface of the plate and towards the substrate 416. Bonding at 650 may include descriptions for bonding at in FIG. 4. In a variation, bonding at 650 may include forming cavities in the substrate (e.g., see 605) after 640 and prior to 650 prior to bonding.

Typically, the mating surfaces of the substrate 420 and the piezoelectric plate 412 are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

The different plate thicknesses of membranes 410 and 450 formed at 630 can be used to tune the resonance frequencies of those resonators 402 and 404 on a single chip, rather than by using a dielectric frequency setting layer on the membranes. A front-side dielectric layer or layers do not need to be formed to further tune the shunt resonator. The different thickness of these piezoelectric membranes can instead be selected to cause selected XBARs to be tuned to different frequencies as compared to the other XBARs.

At 660 the sacrificial substrate 416 is removed to form chip 400. This may include removing adhesive layer 414 to expose the surface of the piezoelectric plate (the surface that previously faced the sacrificial substrate). Removing at 660 may include releasing a temporary wafer having substrate 416. In some cases, at 660 the sacrificial substrate 416 is removed after the backside processing is completed at 650 by emitting a laser through the glass of substrate 416 to release the glass. Then the adhesive material and laser release material is washed off.

The sacrificial substrate 416 and layer 414 may be removed by a laser debonding process that irradiates a laser through the substrate 416 and to the laser release layer that is over the adhesive layer 414; thus, releasing the adhesive layer from the substrate 416. Next, a cleaning fluid, such as SPIS-TA-CLEANER28, can be used to clean the remaining laser release material from off of the adhesive layer 414. Then a cleaning rinse, such as isopropyl alcohol (IPA), can be used to clean the adhesive layer 414 from the IDTs and surface of the plate 412.

In other cases, the sacrificial substrate 416 and layer 414 may be removed, for example, by material-dependent wet or dry etching or some other process. The substrate 416 can be etched, for example, by an anisotropic plasma etching, reactive ion etching, wet chemical etching, and/or other etching technique. Layer 414 may be impervious to or be etched magnitudes slower by the processes and chemicals used to etch substrate 416. After this etch, the layer 414 may be removed from the top surface of plate 412 and IDTs, such as by selective etching.

Removing at 660 may include etching away or otherwise removing a support wafer to form resonators 402 and 404. After removing at 660, what remains on the wafer includes membranes 410 and 450 as shown. FIGS. 1-4 may show examples of the fingers of selected IDTs after completion at 660.

Other actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device.

One action that may optionally occur at 660 is a SiO2 raster trim of an encapsulation/passivation layer or another front side dielectric formed on membrane 410 and/or 450 to tune the frequency of the resonators 402 and 404. The raster trim may use a laser to burn away small portion areas and/or thickness of the bonding layer and/or dielectric to tune the frequency of the resonators.

Process 600 may end at 660 with XBARs with resonators 402 and 404 formed on the same chip 400 with different membrane thicknesses tp2 and tp1, respectively, to tune the membranes as desired for shunt and series filtering. In other cases, the process continues with other actions.

Using device 400 and/or process 600 enables XBAR resonators 410 and 450 on the same chip to have different membrane thicknesses that are accurately formed. This avoids difficulties in accurately fabricating desired membrane thicknesses; sensitivities of resonator frequency characteristics to the accuracy of the thickness of their membranes; and sensitivities of resonator characteristics to the acoustic and piezoelectric properties of their membranes. Device 400 and/or process 600 solves these problems by providing means of accurately fabricating multiple membrane thicknesses on a chip without significantly degrading resonator characteristics (e.g., resonant and anti-resonant frequencies and quality factor (Q), spurs, coupling, power handling, temperature coefficient of frequency (TCF)) or mechanical or thermal membrane characteristics.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A method for fabricating an acoustic filter with multiple piezoelectric plate thicknesses on a single chip, comprising:
   forming conductor patterns on a piezoelectric plate;
   bonding the piezoelectric plate to a sacrificial substrate, with the conductor patterns facing the sacrificial substrate;
   thinning the piezoelectric plate to a first thickness for shunt resonators;
   applying a mask and further thinning selected areas of the piezoelectric plate to a second thickness for series resonators to form a thinned piezoelectric plate;

bonding a substrate with a plurality of cavities to the thinned piezoelectric plate; and
removing the sacrificial substrate.

2. The method of claim 1, wherein applying the mask and further thinning selected areas includes patterning the mask to expose the selected areas and ion milling the exposed selected areas to remove a milled away thickness of the piezoelectric plate to form the second thickness for series resonators.

3. The method of claim 1, wherein the conductor patterns include interdigital transducers (IDTs) that are each on a front surface of the piezoelectric plate and that are over a respective cavity that is below a back surface of the piezoelectric plate.

4. The method of claim 3, wherein the IDTs are on membranes of the piezoelectric plate that span the plurality of cavities, respectively, and
wherein non-selected areas of the piezoelectric plate have the first thickness for shunt resonators and form shunt membranes of the piezoelectric plate that are over shunt cavities of the plurality of cavities; and
wherein the selected areas have the second thickness for the series resonators and form series membranes of the piezoelectric plate that are over series cavities of the plurality of cavities.

5. The method of claim 3, wherein the bonding includes flipping the piezoelectric plate so that the selected areas on a back surface of the piezoelectric plate are facing and span the series cavities and the IDTs are on a front surface of the piezoelectric plate.

6. The method of claim 3, wherein the thinning of the piezoelectric plate to a first thickness for shunt resonators includes:
planarizing a front surface of the piezoelectric plate;
forming the IDTs on the planarized front surface of the piezoelectric plate;
planarizing a back surface of the piezoelectric plate to the first thickness for shunt resonators.

7. The method of claim 6, wherein applying the mask and further thinning selected areas of the piezoelectric plate to a second thickness for series resonators includes:
masking the back surface of the piezoelectric plate having the first thickness for shunt resonators to expose only the selected areas;
ion milling the exposed selected areas to remove a milled away thickness of the piezoelectric plate to form the second thickness for series resonators.

8. The method of claim 7, further comprising:
flip bonding the planarized front surface of the piezoelectric plate having the IDTs to a support wafer prior to planarizing the back surface of the piezoelectric plate;
flip bonding the back surface of the piezoelectric plate to the substrate using the support wafer after ion milling the masked back surface to the second thickness for series resonators; and
removing the support wafer.

9. The method of claim 1, wherein bonding the piezoelectric plate to a sacrificial substrate includes:
forming an adhesive layer over the front surface of the piezoelectric_plate and over the conductor patterns; and
bonding the adhesive layer to the sacrificial substrate; and wherein removing the sacrificial substrate includes removing the adhesive layer.

10. The method of claim 1, further comprising tuning a frequency of the shunt and series resonators using the respective thicknesses of the shunt and series resonators such that a radio frequency signal applied to shunt IDTs and series IDTs excite different shunt and series primary shear acoustic modes in the shunt and series resonators.

11. A method for fabricating an acoustic resonator device on a single chip, the method comprising:
forming conductor patterns on a piezoelectric plate;
bonding the piezoelectric plate to a sacrificial substrate using an adhesive layer between the piezoelectric plate and the sacrificial substrate, with the conductor patterns facing the sacrificial substrate;
thinning the piezoelectric plate to a desired thickness for shunt resonators;
applying a mask and further thinning selected areas of the piezoelectric plate to another desired thickness for series resonators to form a thinned piezoelectric plate;
bonding a substrate of the single chip with swimming pool cavities to the further thinned piezoelectric plate;
removing the sacrificial substrate; and
removing the adhesive layer.

12. The method of claim 11, wherein applying the mask and further thinning selected areas includes patterning the mask to expose the selected areas and ion milling the exposed selected areas to remove a milled away thickness of the plate to form the desired thickness for series resonators.

13. The method of claim 11, wherein the conductor patterns include series resonator and shunt resonator interdigital transducers (IDTs), wherein each series resonator and shunt resonator IDT is on a front surface of the piezoelectric plate and is over a swimming pool cavity that is below a back surface of the piezoelectric plate.

14. The method of claim 13, wherein the series resonator and shunt resonator IDTs are on membranes of the piezoelectric plate that span the swimming pool cavities, and
wherein non-selected areas of the piezoelectric plate have the desired thickness for shunt resonators and form shunt membranes of the piezoelectric plate that span shunt cavities of the swimming pool cavities; and
wherein the selected areas have the desired thickness for the series resonators and form series membranes of the piezoelectric plate that span series cavities of the swimming pool cavities.

15. The method of claim 13, wherein bonding includes flipping the plate so that the selected areas on a back surface of the plate are facing and span the series cavities and the series resonator and shunt resonator IDTs are on a front surface of the plate.

16. The method of claim 13, wherein thinning the piezoelectric plate to a desired thickness for shunt resonators includes:
planarizing a front surface of the plate;
forming the series resonator and shunt resonator IDTs on the planarized front surface of the plate;
planarizing a back surface of the plate to the desired thickness for shunt resonators.

17. The method of claim 16, wherein applying a mask and further thinning selected areas of the piezoelectric plate to a desired thickness for series resonators includes:
masking the back surface of the plate having the desired thickness for shunt resonators to expose only the selected areas;
ion milling the exposed selected areas to remove a milled away thickness of the plate to form the desired thickness for series resonators.

18. The method of claim 17, further comprising:
flip bonding the planarized front surface of the plate having the series resonator and shunt resonator IDTs to a support wafer prior to planarizing the back surface of the plate;
flip bonding the back surface of the plate to the substrate using the support wafer after ion milling the masked back surface to a desired thickness for series resonators; and
removing the support wafer.

19. The method of claim 11, wherein bonding the piezoelectric plate to a sacrificial substrate includes:
forming the adhesive layer over the front surface of the plate and over the conductor patterns; and
bonding the adhesive layer to the sacrificial substrate.

20. The method of claim 19, wherein bonding the piezoelectric plate to a sacrificial substrate includes:
forming a laser release material (LRL) on a back surface of sacrificial substrate; and
bonding the adhesive layer to the LRL; and
wherein removing the sacrificial substrate includes removing the LRL prior to removing the adhesive layer.

\* \* \* \* \*